US010545547B2

(12) United States Patent
Zhai et al.

(10) Patent No.: US 10,545,547 B2
(45) Date of Patent: Jan. 28, 2020

(54) DEVICE HAVING TIME DIVISION MULTIPLEXING CAPABILITY OF HEAT DISSIPATION

(71) Applicant: Dell Products L.P., Round Rock, TX (US)

(72) Inventors: Haifang Zhai, Shanghai (CN); Hendry Xiaoping Wu, Shanghai (CN); David Dong, Shanghai (CN); Yujie Zhou, Shanghai (CN)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 16/248,286

(22) Filed: Jan. 15, 2019

(65) Prior Publication Data
US 2019/0220072 A1    Jul. 18, 2019

(30) Foreign Application Priority Data

Jan. 18, 2018  (CN) .......................... 2018 1 0049850

(51) Int. Cl.
*G06F 1/20* (2006.01)
*H05K 5/02* (2006.01)
*H05K 7/20* (2006.01)

(52) U.S. Cl.
CPC ............. *G06F 1/206* (2013.01); *H05K 5/026* (2013.01); *H05K 7/2039* (2013.01); *G06F 2200/201* (2013.01)

(58) Field of Classification Search
CPC ...... G06F 1/206; G06F 2200/201; G06F 1/20; G06F 1/203; H05K 5/026; H05K 7/2039; H05K 7/20154; H05K 7/20145; H05K 1/0203; H05K 7/20272; H05K 7/20281; H05K 1/181; H05K 2201/066; H05K 7/20136; H05K 7/20209; H05K 7/20718; H05K 7/20909; H05K 7/20972; H01L 2924/0002; H01L 23/467; H01L 23/3672; F28F 3/02; F28F 13/12; F28F 2215/10; F28F 13/06; F28F 13/08; F28F 2250/08; F28F 13/00; F28F 2280/10; F28F 27/02; F28D 2021/0029
USPC ............... 361/694, 697, 695, 704, 690, 703, 361/679.54, 709
See application file for complete search history.

(56) References Cited

U.S. PATENT DOCUMENTS

| 9,507,391 B2 * | 11/2016 | Busch | G06F 1/20 |
| 2009/0321044 A1 * | 12/2009 | Hernon | H01L 23/34 165/80.2 |
| 2016/0077558 A1 * | 3/2016 | Delano | F28F 13/06 361/679.47 |

\* cited by examiner

*Primary Examiner* — Mandeep S Buttar
(74) *Attorney, Agent, or Firm* — Ryan, Mason & Lewis, LLP

(57) ABSTRACT

In the embodiments of the present disclosure, a device having time division multiplexing capability of heat dissipation is provided, including: a first component and a second component arranged in different orientations; and a heat sink arranged to guide an air flow flowing through the heat sink to the first component and the second component respectively during different time periods. Therefore, the device having time division multiplexing capability of heat dissipation of the present disclosure may reduce the number of heat sinks in the device and thus, reduce the overall size of the device.

11 Claims, 6 Drawing Sheets

US 10,545,547 B2

DEVICE HAVING TIME DIVISION MULTIPLEXING CAPABILITY OF HEAT DISSIPATION

RELATED APPLICATION(S)

The present application claims priority to Chinese Patent Application No. 201810049850.9, filed Jan. 18, 2018 and entitled "Device Having Time Division Multiplexing Capability of Heat Dissipation," which is incorporated by reference herein in its entirety.

FIELD

Embodiments of the present disclosure generally relate to the field of heat dissipation, and more specifically, to a device having time division multiplexing capability of heat dissipation and an apparatus including the device.

BACKGROUND

With increasing integration of electronic and electrical devices as well as the tendency of miniaturization, heat dissipation has become a crucial issue. In some cases, the operating temperature of an electronic device directly determines its service life and stability. To maintain the operating temperature of each component of, for instance, an electronic device, within a reasonable range, it is necessary to thermally manage the heat generated within the electronic device, in addition to ensuring that the electronic device is located at an external working environment temperature within a reasonable range. Effective heat dissipation should be achieved, especially for heat-sensitive devices.

SUMMARY

Embodiments of the present disclosure provide a solution for providing a device having time division multiplexing capability of heat dissipation and an apparatus including the device.

In a first aspect, a device having time division multiplexing capability of heat dissipation is provided. The device comprises: a first component and a second component arranged in different orientations; and a heat sink configured to direct an air flow flowing through the heat sink respectively to the first component and the second component during different time periods.

In accordance with some embodiments of the present disclosure, the heat sink includes a rotatable set of cooling fins configured to control a direction of the air flow by rotating the orientations of the cooling fins.

In accordance with some embodiments of the present disclosure, the heat sink is configured to switch the air flow to the second component in response to an air pressure of the air flow exceeding a threshold.

In accordance with some embodiments of the present disclosure, the heat sink is further configured to switch the air flow to the first component in response to the air pressure of the air flow being below a threshold.

In accordance with some embodiments of the present disclosure, the heat sink includes a coil spring configured to be operable to drive the cooling fins to rotate in response to the air pressure of the air flow being below or above a threshold, so as to change the air flow direction.

In accordance with some embodiments of the present disclosure, the heat sink comprises a fixed baseplate and a rotatable baseplate, between which the coil spring is arranged and operable to drive the rotatable baseplate.

In accordance with some embodiments of the present disclosure, a third component is further provided. The heat sink is arranged on the third component and the fixed baseplate contacts the third component so as to dissipate heat for the third component.

In accordance with some embodiments of the present disclosure, the device is an input/output (I/O) card.

In accordance with some embodiments of the present disclosure, the first component is an M.2 card, where the second component is a battery.

In accordance with some embodiments of the present disclosure, the third component is a central processing unit.

In a second aspect, an electronic apparatus including the device described in the first aspect is provided.

In a third aspect, an electrical apparatus including the device described in the first aspect is provided.

BRIEF DESCRIPTION OF THE DRAWINGS

In the drawings, similar/identical reference signs generally represent similar/identical parts throughout different views. The drawings are not necessarily drawn to scale, but generally emphasize illustration of principles of the present disclosure. In the drawings.

DETAILED DESCRIPTION

Figure 1:
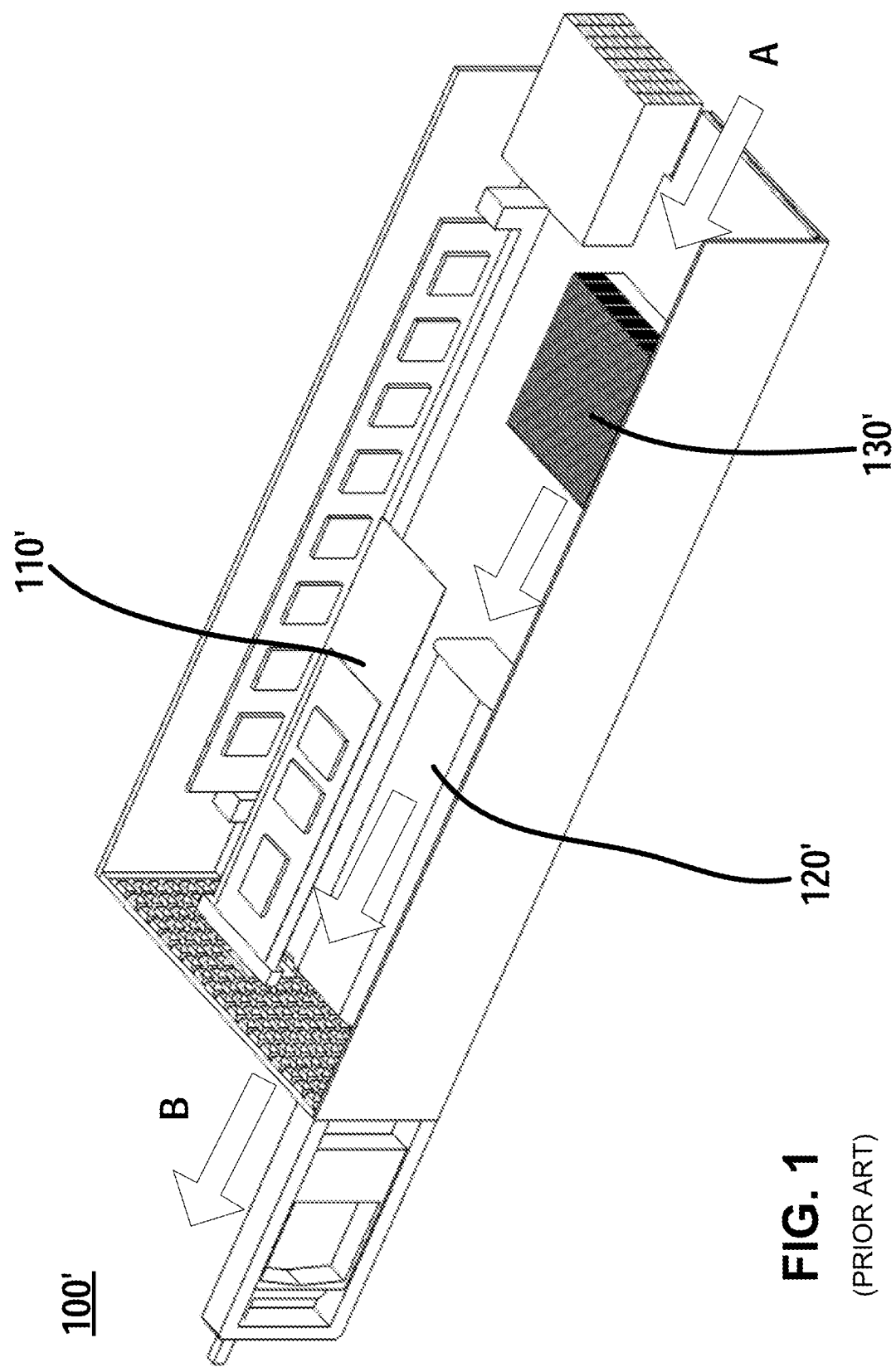
FIGS. 1-2 are structural schematic diagrams illustrating respectively two different heat dissipation paths inside an I/O card in the prior art.

Principles of the present disclosure will be described with reference to various example embodiments illustrated in the drawings. It should be appreciated that description of these embodiments is merely to enable those skilled in the art to better understand and further implement the present disclosure and is not intended for limiting the scope disclosed herein in any manner. It should be noted that similar or identical reference signs may be used in the drawings under possible conditions, and similar or identical reference signs may represent similar or identical functions. Those skilled in the art shall realize easily that from the following depiction, alternative embodiments of the structure and method illustrated in the present disclosure may be utilized without departing from the principles of the present disclosure described herein.

The existing electronic apparatuses, such as I/O cards, generally require heat dissipation to guarantee the service life and stability of the electronic apparatuses, such as I/O cards. Therefore, heat dissipation is crucial for such electronic apparatus. The present disclosure relates to improvement of the heat dissipation performance of the existing electronic apparatuses.

In the following, particularly for the ease of depiction, an I/O card will be taken as an example of the electronic apparatus which requires heat dissipation to analyze problems existing in traditional solutions and to describe several example embodiments of the present disclosure. However, it is to be understood that this is only illustrative, rather than to limit the scope of the present disclosure in any manner. The ideas and principles depicted herein are applicable to any apparatus that requires heat dissipation currently known or to be disclosed in the future.

Figure 2:
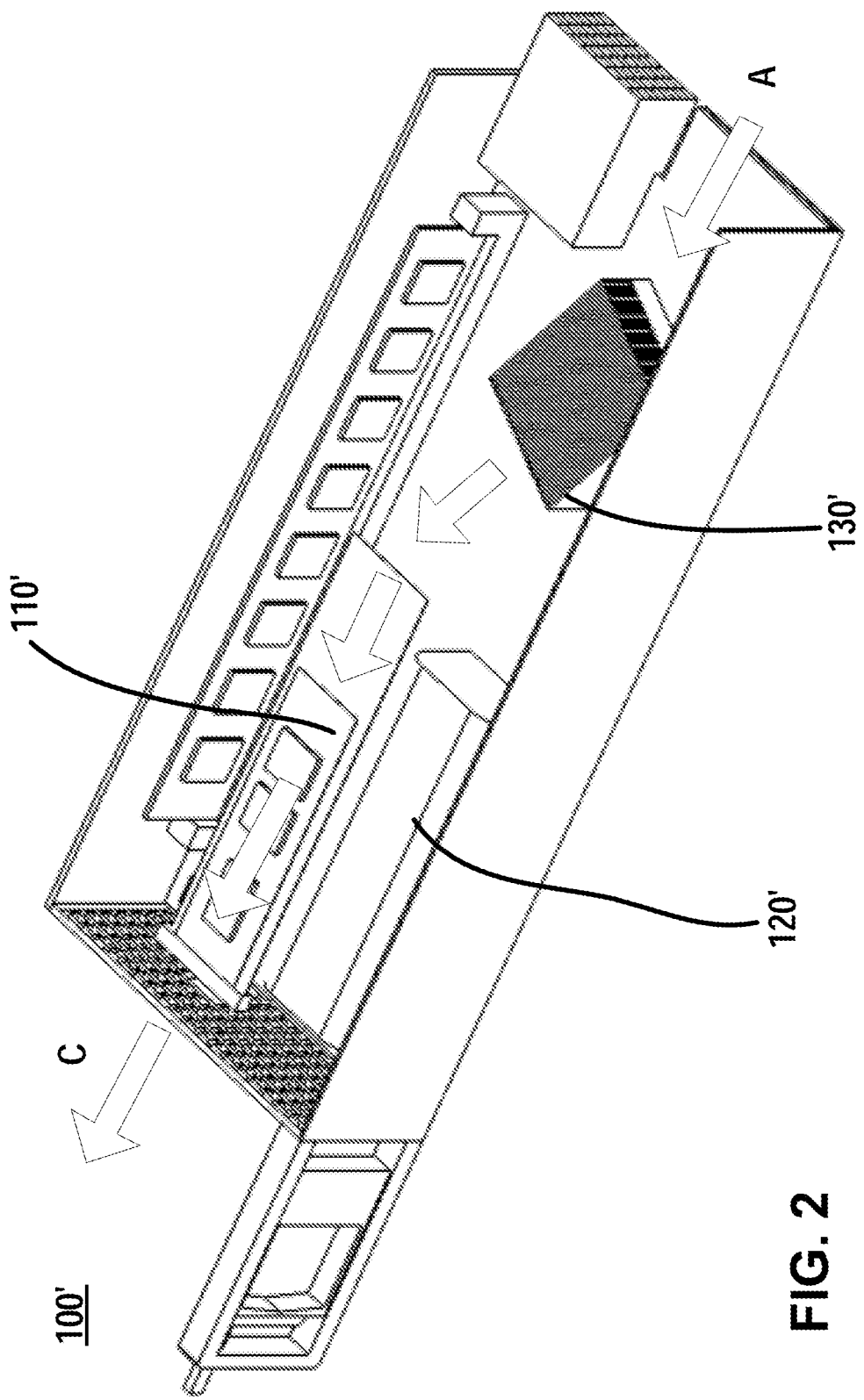

FIGS. 1-2 are structural schematic diagrams illustrating respectively two heat dissipation paths inside an I/O card in the prior art. As shown in FIGS. 1-2, I/O card 100' includes a first component 110', a second component 120' and a heat sink 130', where the first component 110' may be an M.2 card and the second component 120' may be a battery. To dissipate heat for the heat-generating components (e.g., CPU) in the I/O card, the heat sink 130' may be fixedly mounted on the third component CPU, meanwhile the external cooling air flow enters from a side of the I/O card (as shown by arrow A) and passes through the heat sink 130' above the CPU, and then exits from the other side of the I/O card (as shown by arrow B or C). In FIG. 1, the heat sink 130' is arranged to guide the cooling air flow to the second component 120' so that the heat sink 130' and the second component 120' are in the same air flow path. FIG. 2 differs from FIG. 1 in that the heat sink 130' is arranged to guide the cooling air flow to the first component 110' so that the heat sink 130' and the first component 110' are in the same air flow path. As will be discussed below, it might be disadvantageous to always arrange the heat sink 130' in the same air flow path with the first component 110' or second component 120'.

According to the heat dissipation design specification of the I/O card, it is required for the components inside the I/O card to operate in an environment with a temperature under 35° C. within at least 90% of the operating time period, and operate in an environment with a temperature ranging from 35° C. to 40° C. within at most 10% of the time period. Some components may be more demanding for ambient temperature. For example, for a battery, although the battery is allowed to operate under an ambient temperature as high as 35° C. to 40° C. for a short time, it is undesirable to expose the battery in a warm environment with a temperature ranging from 35° C. to 40° C., or even lower than 35° C., for a long time, because it would lead to a reduction of the service life and reliability of the battery; while for an M.2 card, it requires an operating environment with a temperature lower than 35° C., otherwise, the M.2 card would malfunction; that is, the M.2 card cannot endure a warm environment with a temperature higher than 35° C. for any long or short time. It should be noted that above numeric values are only illustrative, rather than to limit in any manner.

However, the design of the heat dissipation path for the existing I/O card as shown in FIGS. 1-2 is disadvantageous both for a battery and an M.2 card with the above heat requirement. Specifically, besides a battery and an M.2 card, an existing I/O card is further designed with CPU. When the CPU is in the operating mode, the cooling air flow becomes warm after passing through the heat sink 130' over the CPU, which might cause the temperature of the air flow downstream of the heat sink 130' to reach an ambient temperature e.g., over 35° C., or even e.g., between 35° C. and 40° C. The arrangement of the heat dissipation path shown in the above FIG. 1 or FIG. 2 indicates that: when the temperature of the air flow downstream of the heat sink 130' reaches a high ambient temperature, e.g., over 35° C., or e.g., between 35° C. and 40° C., the first component 110' or the second component 120' will have to endure the above high ambient temperature and thus, it is impossible to utilize the thermo-resistance difference between the first component 110' and the second component 120' to minimize the influence of the hot ambient temperature to the operation of the I/O card.

Additionally, because of the miniaturization tendency of the I/O card, it is not feasible to provide an additional heat sink in the limited space of the small I/O card to dissipate heat for the battery and the M.2 card. Therefore, in the case that the existing I/O card only allows a limited number of heat sinks, or even one heat sink, how to improve the heat dissipation performance inside the I/O card to facilitate the normal operation of the I/O card remains a technical problem to be solved in the art.

Figure 3:
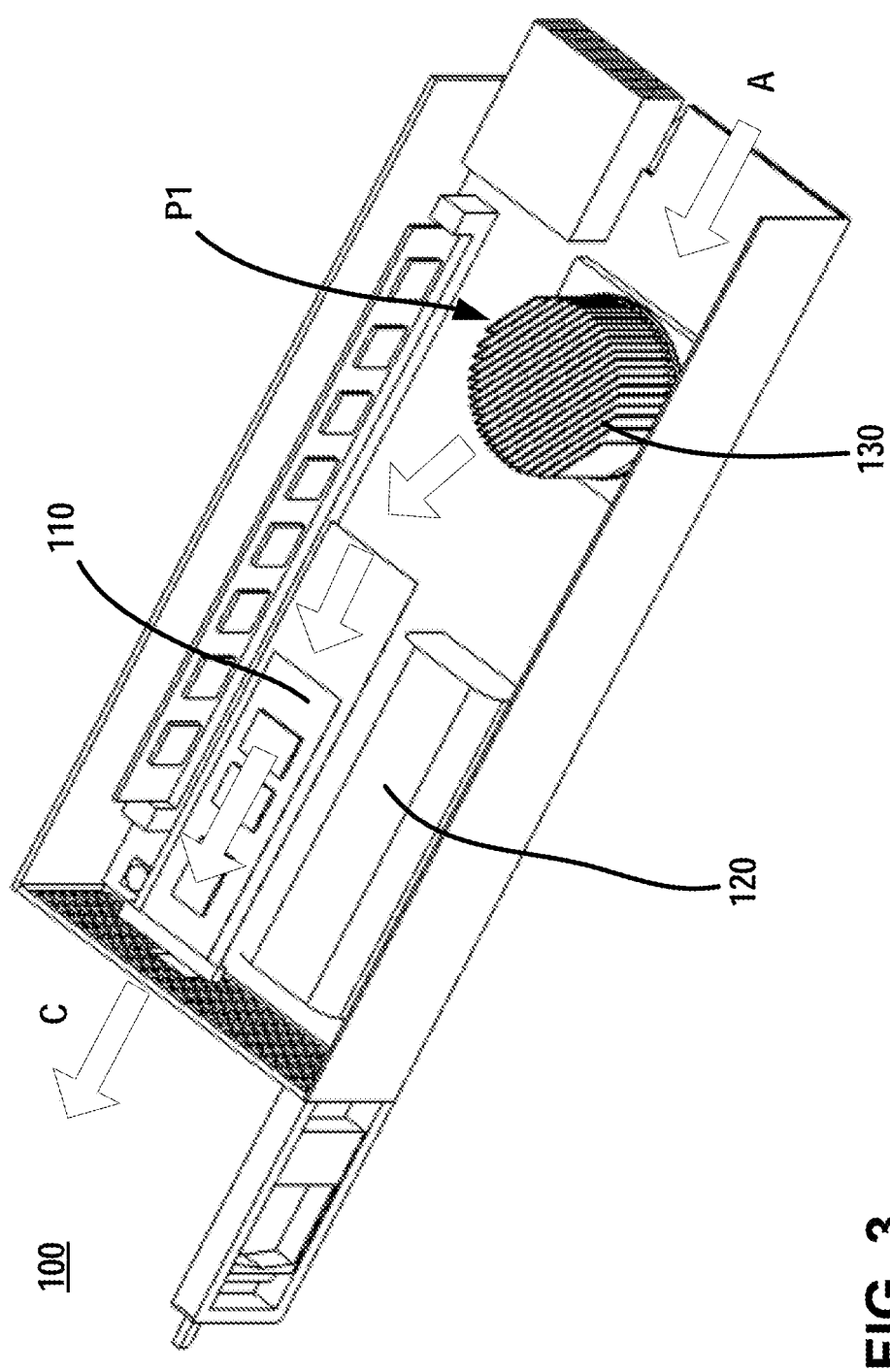
FIG. 3 is a structural schematic diagram illustrating a heat sink being in a first guiding position in an I/O card according to an embodiment of the present disclosure.
Figure 4:
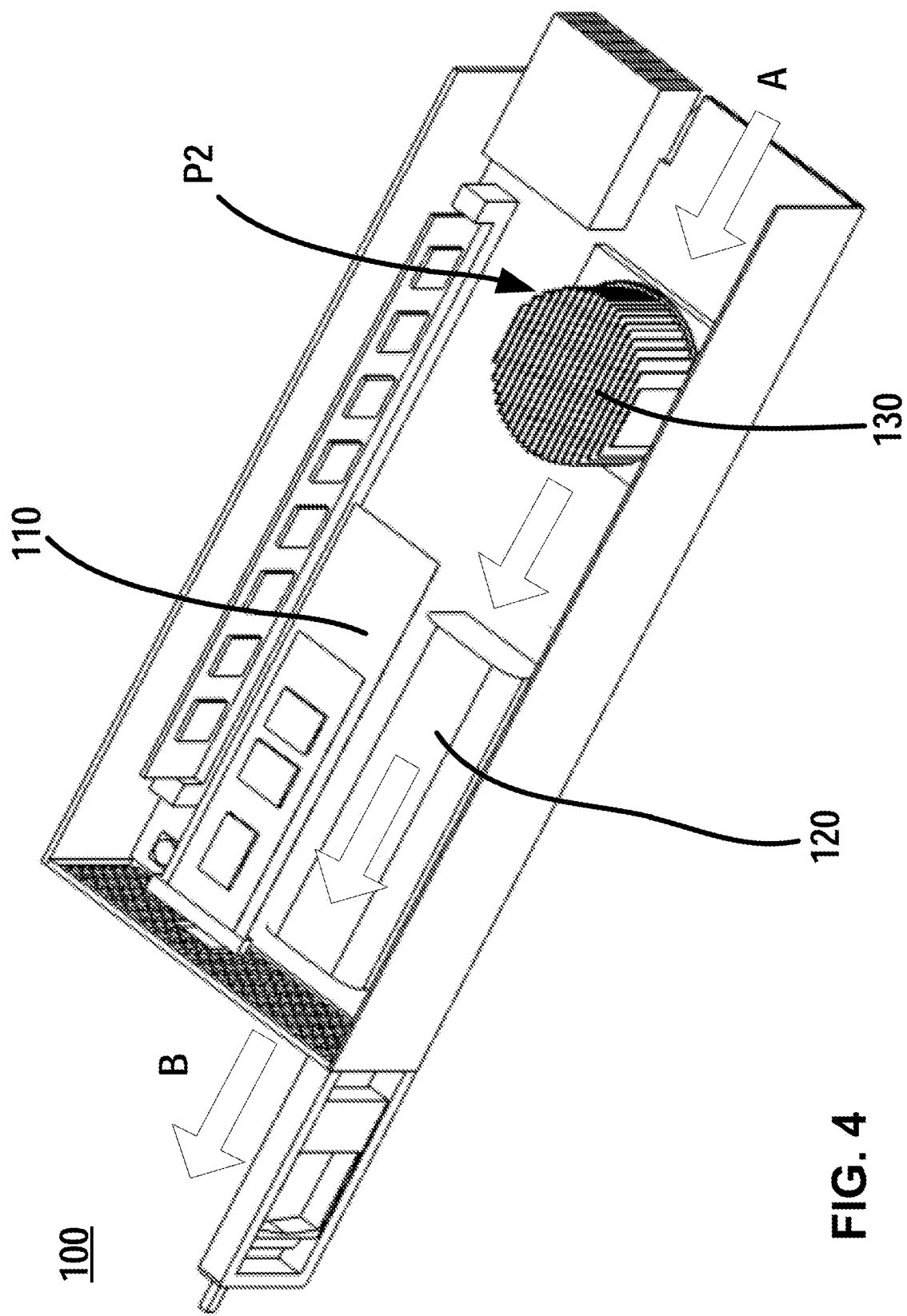
FIG. 4 is a structural schematic diagram illustrating a heat sink being in a second guiding position in an I/O card according to an embodiment of the present disclosure.

FIGS. 3-4 are structural schematic diagrams illustrating an I/O card 100 with improved heat dissipation performance. Similar to the structure of the I/O card of the prior art illustrated in FIGS. 1-2, the I/O card 100 of the present disclosure illustrated in FIGS. 3-4 includes a first component 110, a second component 120 and a heat sink 130, where the first component 110 may be an M.2 card and the second component 120 may be a battery. To dissipate heat for the heat-generating components (e.g., CPU) in the I/O card, the heat sink 130 is mounted on the third component CPU, and meanwhile, the external cooling air flow enters from one side of the I/O card (shown by arrow A), passes through the heat sink 130 over the CPU, and exits from the other side of the I/O card (shown by arrow B or C). The structure of the I/O card of the present disclosure as shown in FIGS. 3-4 differs from the structure of the I/O card of the prior art as shown in FIGS. 1-2 in that: the heat sink 130 of the present disclosure is arranged to enable the switching between the two heat dissipating paths as shown in FIGS. 1-2.

According to an embodiment of the present disclosure, the switching between the two heat dissipating paths may be realized by arranging the heat sink in different guiding positions. To this end, FIG. 3 shows a structural schematic diagram of a heat sink 130 being in a first guiding position P1 in the I/O card 100 according to an embodiment of the present disclosure; FIG. 4 shows a structural schematic diagram of a heat sink being in a second guiding position P2 in the I/O card 100 according to an embodiment of the present disclosure.

As shown in FIG. 3, when the heat sink 130 is in the first guiding position P1, the cooling fins of the heat sink 130 are at an angle relative to the air flow so that the cooling fins of the heat sink 130 guide the air flow to the first component 110; as shown in FIG. 4, when the heat sink 130 is in the second guiding position P2, the cooling fins of the heat sink 130 are parallel to the air flow so that the cooling fins of the heat sink 130 guide the air flow to the second component 120.

The switching of the first guiding position P1 and the second guiding position P2 may be controlled based on the thermal performance requirement of the first component 110 and the second component 120, or the practical requirements of the user. Therefore, in some embodiments, the heat sink 130 may be arranged, during a first time period, to be in the first guiding position P1 so as to guide the air flow flowing through the heat sink 130 to the first component 110; and during a second time period, to guide the air flow flowing through the heat sink 130 to the second component 120.

In the embodiment of the I/O card 100, in the case that the first component 110 is an M.2 card and the second component 120 is a battery, it is possible to control the switching of the heat dissipating paths of the heat sink 130 based on the temperature of the air flow flowing through the heat sink 130 or the temperature of the third component (e.g., CPU). For this purpose, the I/O card 100 may be further provided with a temperature sensor to detect the temperature of the air flow flowing through the heat sink 130 or the temperature of the third component (e.g., CPU).

As stated above, in the I/O card, a battery is only allowed to be exposed to a high ambient temperature (for instance, higher than 35° C.) for a short time, while an M.2 card is not allowed to be exposed to a high ambient temperature (for instance, higher than 35° C.) for a short or long time.

Therefore, in the embodiment of the I/O card 100, if it is detected that the temperature of the air flow flowing through the heat sink 130 or the temperature of the third component (e.g., CPU) is higher than a predetermined temperature (e.g., 35° C.), then the heat sink 130 may be switched to the second guiding position P2 within a first predetermined time period (e.g., a short time) so as to guide the air flow to the battery 120 to protect the M.2 card and maintain the continuous operation of the I/O card. If it is detected that the temperature of the air flow flowing through the heat sink 130 or the temperature of the third component (e.g., CPU) is lower than a predetermined temperature (e.g., 35° C.), then the heat sink 130 may be rotated to the first guiding position P1 so as to guide the air flow to the M.2 card 110 within a second predetermined time period (e.g., a long time), thereby preventing the warm air flow flowing through the heat sink 130 from blowing to the battery 120 for a long time and causing deterioration of the battery performance, wherein the second predetermined time period is longer than or much longer than the first predetermined time period. In the above embodiment, the above predetermined temperature and the length of the first predetermined time period (e.g., a short time) are determined based on thermal experiments on the first component (e.g., the battery) or experience, and the predetermined temperature and the length of time can ensure that the service life and stability of the first component (e.g., the battery) are substantially unaffected, while the normal operation of the whole apparatus can still be maintained.

Therefore, in the embodiments of the present disclosure, the heat sink 130 may guide the air flow to different components at different time periods according to different heat dissipating requirements of different components. For example, it is possible to guide the air flow to one of the first component and the second component during the first time period, and to the other one of the first component and the second component during the second time period. With the capability of guiding the air flow to different components by the above heat sink during different time periods, i.e., the time division multiplexing capability of heat dissipation, the heat dissipation performance and operating performance of the apparatus that has the need of heat dissipation are improved.

Figure 5B:
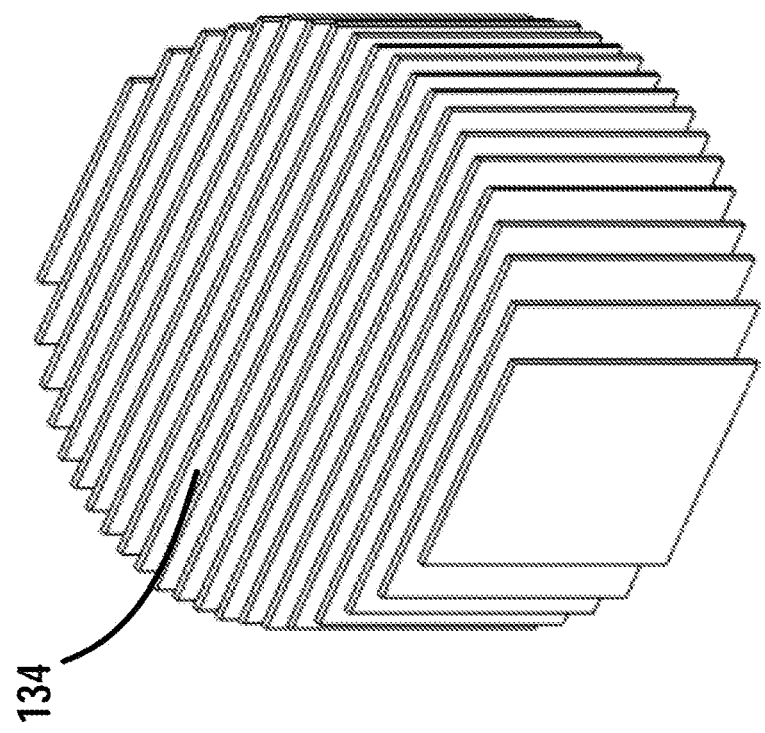
FIGS. 5A-5C are structural schematic diagrams illustrating a heat sink according to an embodiment of the present disclosure.
Figure 5A:
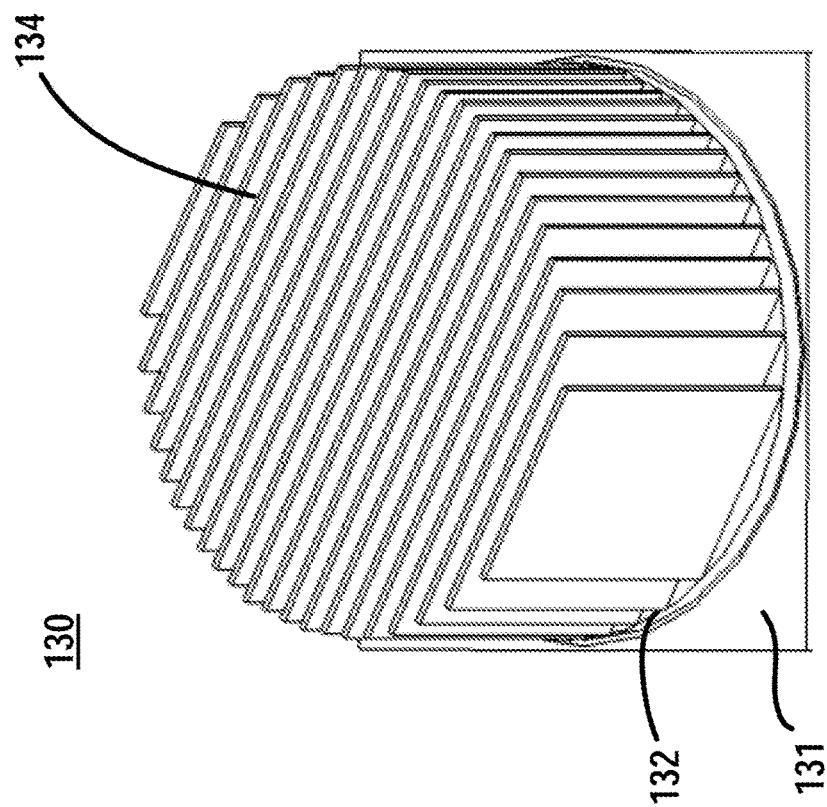
Figure 5C:
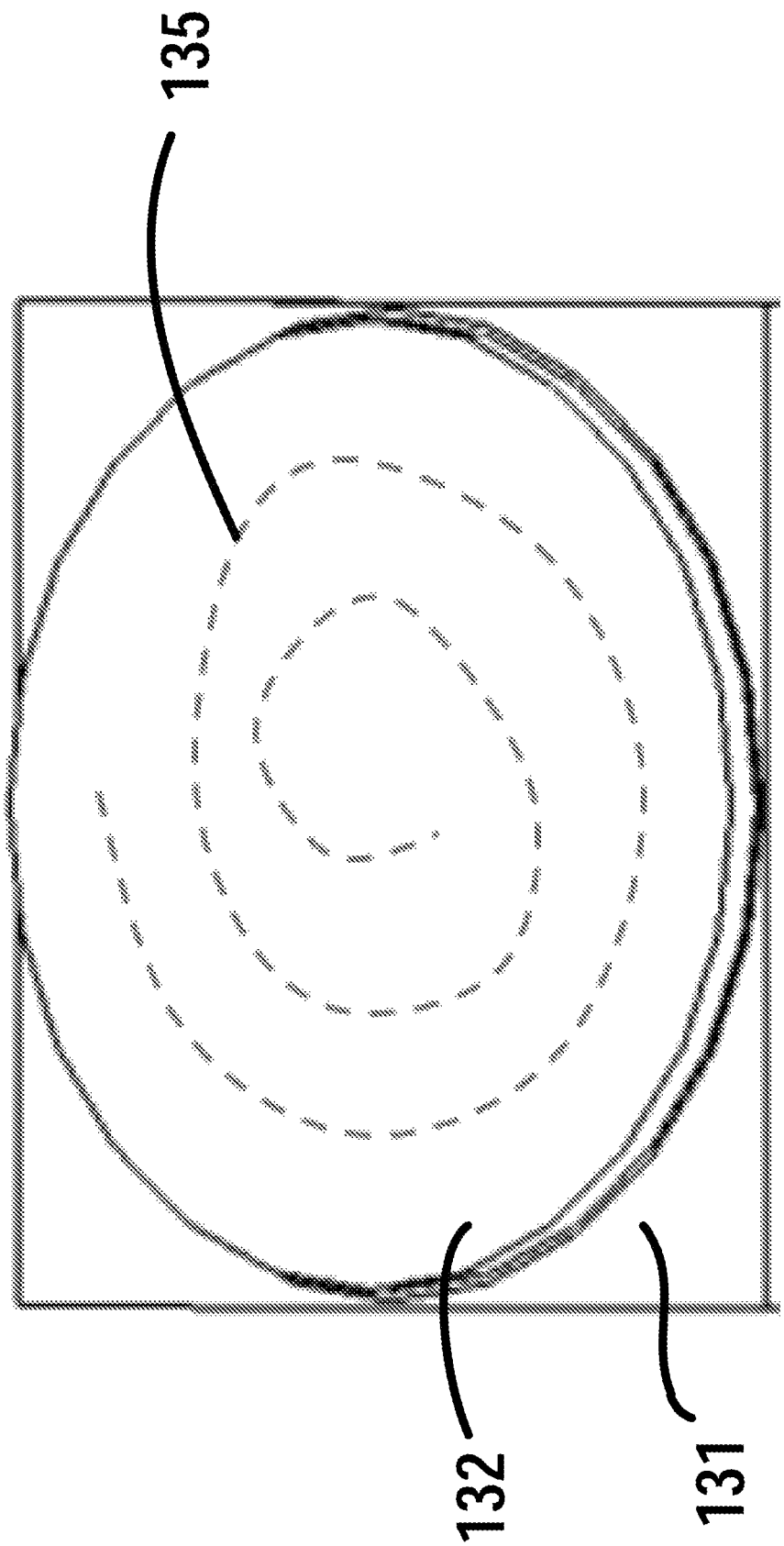

The following will describe the specific implementing manner of the heat sink of the present disclosure in detail. FIGS. 5A-5C show structural schematic diagrams of a heat sink according to an embodiment of the present disclosure.

As shown in FIGS. 5A-5C, the heat sink 130 includes a fixed baseplate 131, a rotatable baseplate 132, a set of cooling fins 134 and a coil spring 135. The fixed baseplate 131 is mounted on the third component (e.g., CPU) so as to directly dissipate heat for the third component. The rotatable baseplate 132 is rotatable relative to the fixed baseplate 131 so as to drive the cooling fins 134 mounted on the rotatable baseplate 132 to rotate together. The set of heat dissipating fins 134 are arranged on the rotatable baseplate 132 to limit the passage that the air flow passes through, thereby controlling the air flow direction by rotating the orientation of the cooling fins 134.

In some embodiments, the set of cooling fins 134 are a plurality of parallel cooling fins. However, in other embodiments, the cooling fins of other shapes may also be possible.

The coil spring 135 is arranged between the rotatable baseplate 132 and the fixed baseplate 131, wherein the holding force generated by the coil spring 135 is designed to be equal to the force generated by applying a certain air pressure threshold of the cooling air flow to the cooling fins 134. Therefore, when the air pressure applied by the cooling air flow to the cooling fins 134 is lower than the above threshold (namely, the force applied by the air flow to the cooling fins 134 is smaller than the holding force generated by the coil spring 135), the cooling fins 134 may be held in the first guiding position P1 at which the cooling fins 134 may be at a predetermined angle relative to the air flow (e.g., about 30°) so as to guide the air flow to the first component 110. When the air pressure applied by the cooling air flow to the cooling fins 134 exceeds the above threshold (namely, the force applied by the air flow to the cooling fins 134 is larger than the holding force generated by the coil spring 135), the coil spring 135 will force the cooling fins 134 to be switched to the second guiding position P2 at which the cooling fins 134 may remain substantially parallel (e.g., about 0°) to the air flow direction, so as to guide the air flow to the second component 120.

In the embodiment of the I/O card 100, the above third component may be a CPU, and the fixed baseplate 131 of the heat sink 130 may be mounted on this CPU directly. Furthermore, the value of the air pressure of the cooling air flow flowing through the heat sink 130 may be adjusted automatically according to the monitored CPU temperature or the air flow temperature detected directly downstream of the heat sink 130. For example, when the monitored CPU temperature or the temperature of the air flow detected directly downstream of the heat sink 130 increases, the flow rate of the cooling air flow may be increased automatically to increase the value of the air pressure. Conversely, the flow rate of the cooling air flow can be reduced automatically accordingly, thereby reducing the value of the air pressure.

Therefore, with the increase of the CPU temperature, or the air flow temperature detected directly downstream of the heat sink 130, the air pressure applied to the heat sink 134 may increase accordingly. When the air pressure of the cooling air flow applied upon the cooling fins 134 exceeds the above threshold (namely, the force applied by the air flow to the cooling fins 134 is larger than the holding force generated by the coil spring 135), the air flow will force the cooling fins 134 to be switched to the second guiding position P2, so that cooling fins 134 will guide the air flow to the second component 120. On the contrary, with the decrease of CPU temperature, or the air flow temperature detected directly downstream of the heat sink 130, the air pressure applied to the cooling fins 134 may decrease accordingly. When the air pressure applied by the cooling air flow to the cooling fins 134 is lower than the above threshold (namely, the force applied by the air flow to the cooling fins 134 is smaller than the holding force generated by the coil spring 135), the cooling fins 134 may be switched back to the first guiding position P1 so that the cooling fins 134 may guide the air flow to the first component 120. Thus, depending on the value of the air pressure applied by the cooling air flow to the cooling fins 134, the coil spring 135 may realize the switching of different heat dissipating paths for the heat sink 130, which enables a time division multiplexing capability for a single heat sink 130 in the apparatus.

Although the time division multiplexing solution for heat dissipation is described mainly for the application scenario of the I/O card 100, those skilled in the art shall appreciate that the time division multiplexing solution for heat dissipation described above is also applicable to other scenarios that require heat dissipation (e.g., in an electronic apparatus or electrical apparatus), particularly advantageously in a spatially limited heat dissipating scenario. With the time division multiplexing solution for heat dissipation of the present disclosure, the number of heat sinks needed in the apparatus, the costs of the product, and the overall design dimension of the product can be reduced.

In addition, although the above describes the control of the switching of different heat dissipating paths for the heat sink by using a coil spring, it is to be understood that in the other embodiments, it is also possible that the above heat sink is not provided with a coil spring, but with a component that has a function similar to that of the coil spring, or may be controlled by means of, for instance, an actuator.

Although the present disclosure has been illustrated and depicted in detail in the drawings and the foregoing description, such illustration and description are to be considered illustrative or exemplary rather than limiting; the present disclosure is not limited to the disclosed embodiments. Other variations of the embodiments of the present disclosure may be understood and practiced by those skilled in the art when practicing the claimed invention by studying the drawings, the present disclosure and the appended claims.

In the claims, the word "comprising" does not exclude other elements, and indefinite articles "a" and "an" do not exclude a plurality. A single element or other elements may fulfill the requirement of multiple items illustrated in the claims. The mere fact that certain measures are recited in the mutually different embodiments or dependent claims does not imply that a combination of these measures cannot be used to advantage. Without departing from the spirit and scope of the present disclosure, the scope of protection of the present disclosure covers any possible combination of features as recited in the various embodiments or dependent claims. Any reference sign in the claims shall not be construed as limiting the scope of the present disclosure.

What is claimed is:

1. A device having time division multiplexing capability of heat dissipation, comprising: a first component and a second component arranged in different orientations; and a heat sink arranged to guide an air flow flowing through the heat sink respectively to the first component and the second component during different time periods; wherein the heat sink comprises a rotatable set of cooling fins configured to control a direction of the air flow by rotating orientations of the cooling fins.

2. The device of claim 1, wherein the heat sink is configured to switch the air flow to the second component in response to an air pressure of the air flow exceeding a threshold.

3. The device of claim 1, wherein the heat sink is configured to switch the air flow to the first component in response to an air pressure of the air flow being lower than a threshold.

4. The device of claim 1, wherein the heat sink comprises a coil spring configured to be operable to drive the cooling fins to rotate in response to an air pressure of the air flow being lower or higher than a threshold, so as to change the direction of the air flow.

5. The device of claim 4, wherein the heat sink comprises a fixed baseplate and a rotatable baseplate, between which the coil spring is arranged, and the coil spring is operable to drive the rotatable baseplate.

6. The device of claim 1, wherein the device is an input/output (I/O) card.

7. The device of claim 6, wherein the first component is an M.2 card and the second component is a battery.

8. The device of claim 7, further comprising a third component, wherein the heat sink is arranged on the third component, and the fixed baseplate contacts the third component so as to dissipate heat for the third component.

9. The device of claim 8, wherein the third component is a central processing unit (CPU).

10. An electronic apparatus, comprising the device according to claim 1.

11. An electrical apparatus, comprising the device according to claim 1.

* * * * *